(12) United States Patent
Ha

(10) Patent No.: US 8,656,092 B2
(45) Date of Patent: Feb. 18, 2014

(54) METHOD FOR READING A MULTILEVEL CELL IN A NON-VOLATILE MEMORY DEVICE

(71) Applicant: Micron Technology, Inc., Boise, ID (US)

(72) Inventor: Chang Wan Ha, San Ramon, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/762,874

(22) Filed: Feb. 8, 2013

(65) Prior Publication Data

US 2013/0339577 A1 Dec. 19, 2013

Related U.S. Application Data

(60) Division of application No. 11/417,573, filed on May 4, 2006, now Pat. No. 7,917,685, and a continuation of application No. 13/073,317, filed on Mar. 28, 2011, now Pat. No. 8,375,179, which is a division of application No. 11/417,573, filed on May 4, 2006, now Pat. No. 7,917,685.

(51) Int. Cl.
*G06F 12/00* (2006.01)
*G06F 13/00* (2006.01)

(52) U.S. Cl.
USPC ............................ 711/103; 711/100; 711/154

(58) Field of Classification Search
USPC .............. 711/100, 103, 117, 118, 119, 154; 365/185.01, 185.03, 185.17, 185.22, 365/185.28, 185.33
See application file for complete search history.

(56) References Cited

U.S. PATENT DOCUMENTS

| | | | |
|---|---|---|---|
| 5,276,848 A | 1/1994 | Gallagher et al. | |
| 5,285,323 A | 2/1994 | Hetherington et al. | |
| 6,373,746 B1 * | 4/2002 | Takeuchi et al. | 365/185.03 |
| 6,385,085 B2 | 5/2002 | Sato et al. | |
| 6,467,030 B1 | 10/2002 | Arimilli et al. | |
| 6,529,405 B2 | 3/2003 | Chang | |
| 6,742,145 B2 | 5/2004 | Bailey et al. | |
| 6,836,431 B2 | 12/2004 | Chang | |
| 6,847,550 B2 | 1/2005 | Park | |
| 6,956,779 B2 | 10/2005 | Tran | |
| 6,961,266 B2 | 11/2005 | Chang | |
| 6,975,539 B2 | 12/2005 | Tran | |
| 7,193,896 B2 | 3/2007 | Shiga | |
| 7,254,071 B2 * | 8/2007 | Tu et al. | 365/201 |
| 7,257,032 B2 | 8/2007 | Fujiu et al. | |
| 7,349,260 B2 | 3/2008 | Guterman | |
| 7,366,022 B2 | 4/2008 | Li et al. | |
| 2003/0009318 A1 | 1/2003 | Amatangelo et al. | |
| 2004/0145454 A1 | 7/2004 | Powell et al. | |
| 2004/0170056 A1 | 9/2004 | Shibata et al. | |
| 2005/0226046 A1 | 10/2005 | Lee et al. | |
| 2005/0273548 A1 | 12/2005 | Roohparvar | |

(Continued)

*Primary Examiner* — Tuan Thai
(74) *Attorney, Agent, or Firm* — Leffery Jay & Polglaze, P.A.

(57) ABSTRACT

A non-volatile memory device has a memory array comprising a plurality of memory cells. The array can operate in either a multilevel cell or single level cell mode and each cell has a lower page and an upper page of data. The memory device has a data latch for storing flag data and a cache latch coupled to the data latch. A read method comprises initiating a lower page read of a memory cell and reading, from the data latch, flag data that indicates whether a lower page read operation is necessary.

20 Claims, 9 Drawing Sheets

(56) References Cited

U.S. PATENT DOCUMENTS

| | | |
|---|---|---|
| 2006/0114723 A1 | 6/2006 | Ju |
| 2006/0221683 A1 | 10/2006 | Chen et al. |
| 2006/0285391 A1 | 12/2006 | Cernea |
| 2007/0097749 A1 | 5/2007 | Li et al. |
| 2007/0153583 A1 | 7/2007 | Guterman |
| 2009/0262578 A1 | 10/2009 | Li et al. |

* cited by examiner

METHOD FOR READING A MULTILEVEL CELL IN A NON-VOLATILE MEMORY DEVICE

RELATED APPLICATION

This application is a divisional of U.S. application Ser. No. 11/417,573, titled "A METHOD FOR READING A MULTILEVEL CELL IN A NON-VOLATILE MEMORY DEVICE," filed May 4, 2006 (now U.S. Pat. No. 7,917,685, issued Mar. 29, 2011), and claims the benefit of the filing date of U.S. application Ser. No. 13/073,317, titled "METHOD FOR READING A MULTILEVEL CELL IN A NON-VOLATILE MEMORY DEVICE," filed Mar. 28, 2011 (allowed), which claims the benefit of the filing date of U.S. application Ser. No. 11/417,573, each of which is commonly assigned and incorporated entirely herein by reference.

TECHNICAL FIELD

The present invention relates generally to memory devices and in particular the present invention relates to non-volatile memory devices.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

As the performance and complexity of electronic systems increase, the requirement for additional memory in a system also increases. However, in order to continue to reduce the costs of the system, the parts count must be kept to a minimum. This can be accomplished by increasing the memory density of an integrated circuit.

Memory density can be increased by using multiple level cells (MLC) instead of single level cells (SLC). MLC memory can increase the amount of data stored in an integrated circuit without adding additional cells and/or increasing the size of the die. The MLC method stores two or more data bits in each memory cell.

FIG. 1 illustrates a typical prior art SLC NAND memory cell array. This figure shows a 16 k bit line and 32 word line memory array as used in a typical 2 kilobyte (kB) memory block. As can be seen, the array is comprised of word lines WL0-WL31 and bit lines BL0-BL16383. Select gate drain (SGD) transistors 101, 102 and select gate source (SGS) transistors 104, 105 are used on each end of each bit line to enable selective access to the array. A source line 100 is coupled to the source end of the serial bit lines.

Each word line of the SLC array is considered to be a page of data. For example, WL0 can be considered to be page 0 with 2 kB of data. WL1 is then page 1. This continues up to WL31 that is labeled page 31.

FIG. 2 illustrates a typical prior art MLC NAND memory cell array. This figure shows basically the same architecture as the SLC array including bit lines BL0-BL16383, WL0-WL31, the SGD transistors 201, 202, SGS transistors 204, 205, and the source line 200. However, the MLC memory array is comprised of 63 pages of data since is has two bits for each memory cell.

Each word line WL0-WL31 of the MLC array is comprised of two pages of data. For example, WL0 is page 0 and page 1 that is equal to 4 kB of data. This continues up to WL31 that is comprised of page 62 and page 63. In other words, the lower pages are even pages page 0, page 2, . . . page 62. The upper page data are the odd pages page 1, page 3, . . . page 63. During a programming operation, the memory controller typically first sends the lower page data for programming then the upper page data is programmed.

A multilevel cell has multiple threshold voltage ($V_t$) windows that each indicates a different state. FIG. 3 illustrates a typical MLC $V_t$ distribution for lower page and upper page data. Multilevel cells take advantage of the analog nature of a traditional flash cell by assigning a bit pattern to a specific voltage range stored on the cell. This technology permits the storage of two or more bits per cell, depending on the quantity of voltage ranges assigned to the cell.

FIG. 3 shows that the lower page of data $V_t$ is comprised of one of two states only (i.e., "11" or "10") where the right-most bit is considered to be the lower page of data. In such a distribution, there is no need for a tight "10" state since there is enough of a $V_t$ difference between the "11" state and the "10" state. The "11" state is typically referred to as the erased state.

The rLP voltage indicated along the $V_t$ axis is the lower page read bias that is applied to the selected word line. An unselected word line voltage is approximately 5.5V to bypass the even upper cell states. The rLP voltage is typically around 0.5V.

The lower distribution of FIG. 3 is the upper page cell $V_t$ distribution. The upper page data is written to the cells already programmed with the lower page of data. The arrows from the lower page $V_t$ distribution to the upper page $V_t$ distribution shows the possible changes in state. For example, the erase state, "11", can become a logical "11" 301 after a logical "1" is programmed into the upper page of data or it can become a logical "01" 302 after the upper page of data is programmed as a logical "0". The lower page programmed state of "10" can either become a logical "00" 305 after the upper page of data is programmed as a logical "0" state or it can become a "10" 306 after the upper page is programmed as a logical "1".

Since there are now four states in the lower distribution of FIG. 3, a tighter cell $V_t$ distribution is required. The voltage r00 is illustrated along the $V_t$ axis. The r00 voltage is the voltage used to bias the word lines in order to read the lower data when the upper data has been written. Typically, r00 is 1.3V.

For the lower page reading of an MLC state, the upper page data is written for the selected word line. For the lower page reading of an SLC state, the upper page data is not written for the selected word line. Therefore, it is necessary to have information available to determine whether the selected word line has had the upper page cell data written.

MLC flash memory devices typically use flag data stored in a flag data cell to indicate to the internal controller inside the flash memory whether the upper page is written or not for the selected word line. For the lower page reading case, the flag data is used by the internal controller inside the flash memory to decide the internal read algorithm. If the flag data shows the upper page is not written, only the lower page is written so that the lower page read needs to be executed further to read correct data. If the flag data shows the upper page data is not written, the already read data is the correct data. Therefore, there is no need for a further read operation. Reading the flag data can cause a data cache busy indicator to indicate, during worst case conditions, that the cache is busy during a time when a lower page read voltage needs to be generated in an MLC device. This can cause a conflict during lower page access in an MLC device.

For the reasons stated above, and for other reasons stated below that will become apparent to those skilled in the art upon reading and understanding the present specification, there is a need in the art for an improved data cache read performance in a multilevel cell memory device.

DETAILED DESCRIPTION

Figure 1:
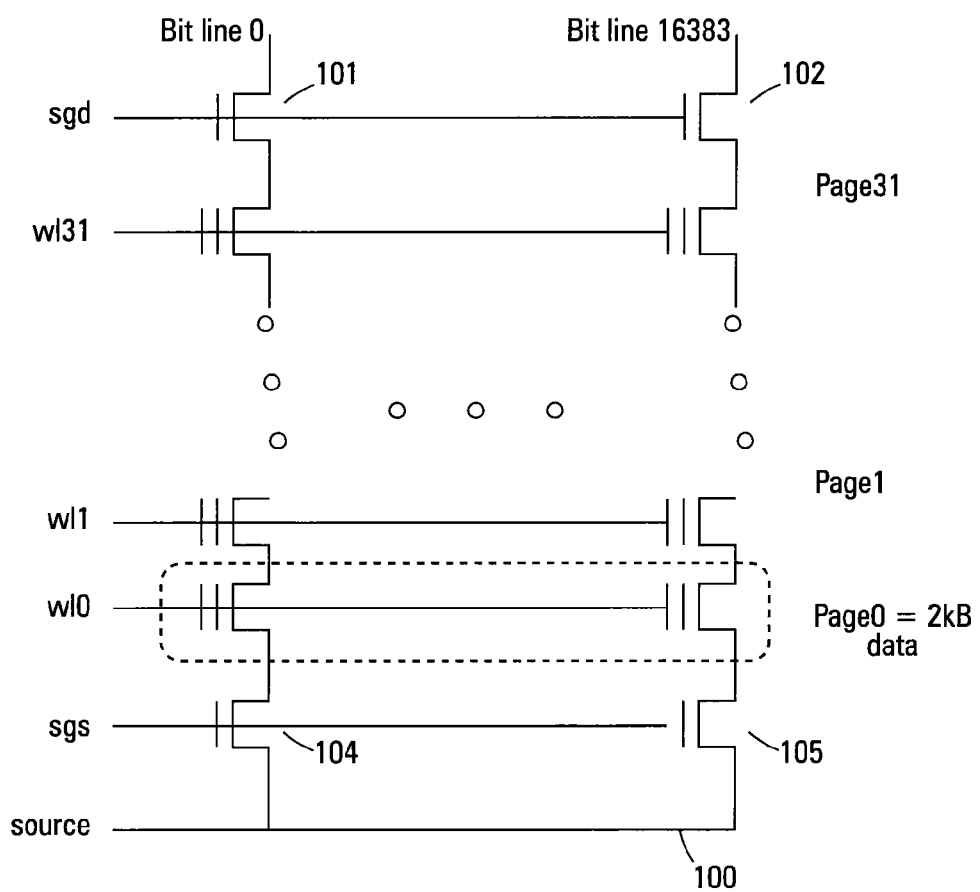
FIG. 1 shows a typical prior art single level cell memory array architecture.
Figure 2:
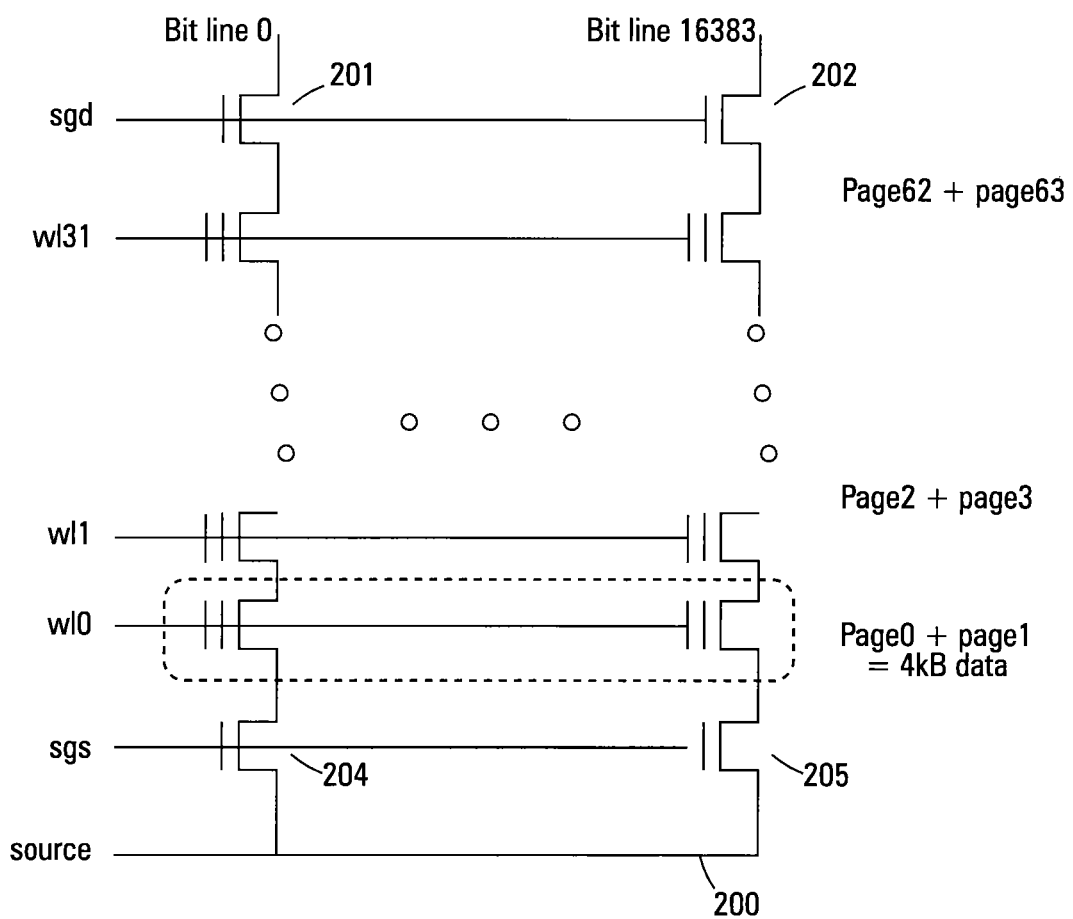
FIG. 2 shows a typical prior art multiple level cell memory array architecture.
Figure 3:
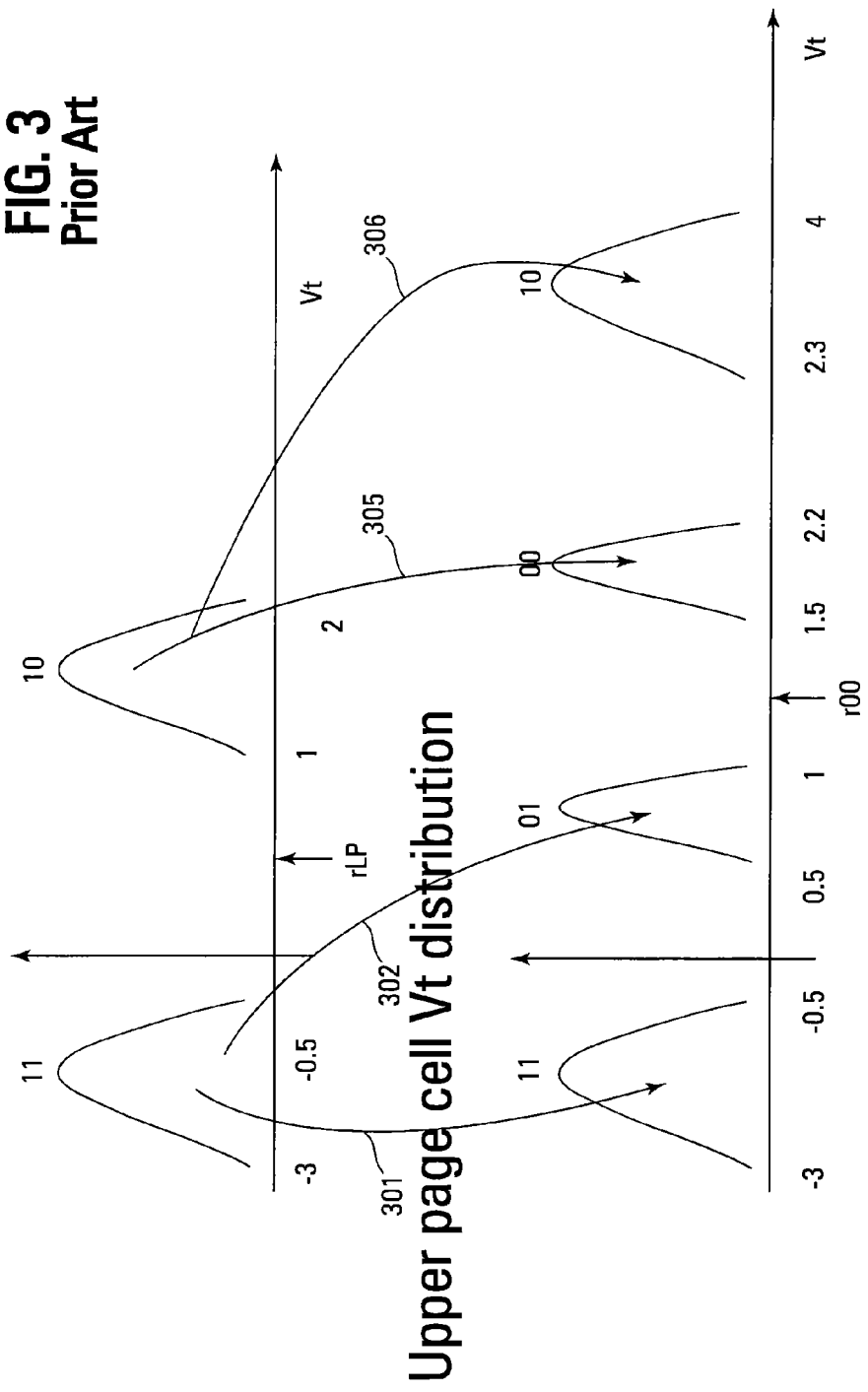
FIG. 3 shows a typical prior art threshold voltage distribution.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 4:
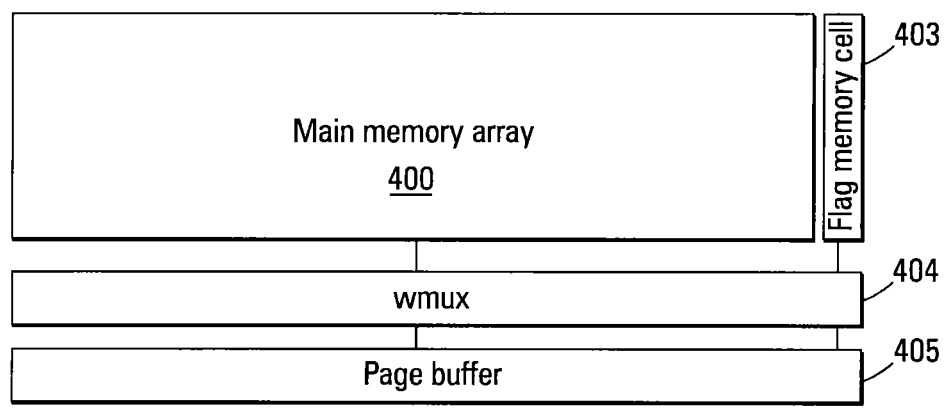
FIG. 4 shows a block diagram of one embodiment of the structures of the flash memory array, flag memory array, and page buffers.

FIG. 4 illustrates a block diagram of one embodiment of a memory device including the flash memory array, flag memory cell array, and page buffers. This figure shows the main memory array 400 coupled to a flag memory cell array 403. The flag memory cell array stores the flag data that provides the indication as to whether each main memory array 400 cell is an MLC memory or an SLC memory.

The array blocks 400, 403 are coupled to a page buffer cache block 405 through a wired multiplexer 404. The page buffer cache 405 temporarily stores data that is being written to or read from the arrays 400, 403 in order to increase the read and write speeds of the memory device. The page buffer 405 includes a sense amplifier circuit, a data latch, and a cache latch for memory operation.

For a memory operation where the upper page data is written for the selected word line, the r00 voltage is internally processed to read the lower page of data. For a memory operation where the upper page data is not written for the selected word line, the rLP voltage is internally processed to read the lower page of data. Thus, the flag memory cell array 403 provides a record of how a memory cell has been programmed. When the upper page data is programmed, the flag memory cell associated with that page is also programmed. When lower page data is read, the associated flag memory cell is also read. This flag cell information is used to determine how to proceed during a lower page read algorithm.

Figure 5:
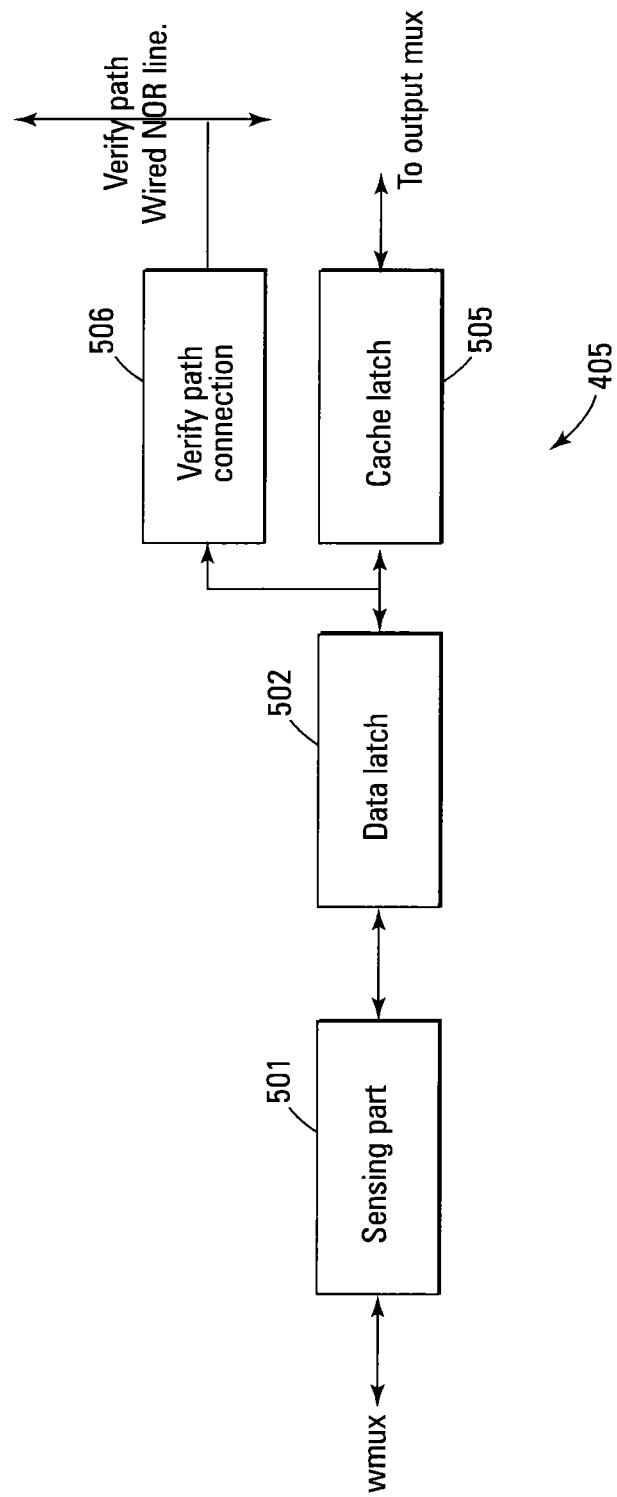
FIG. 5 shows a simplified block diagram of a page buffer function.

FIG. 5 illustrates a simplified block diagram of one embodiment of a page buffer function. The MLC page buffer 405 includes a sensing circuit 501 and a data latch 502 that stores sensed data during a read operation.

Data to be programmed during a programming operation is also stored in the data latch 502. Then the cache latch 505 stores the data that is read before being output to the output multiplexer of the memory device during a read operation. Additional latches 506 are coupled to a verify-path wired NOR line.

Figure 6:
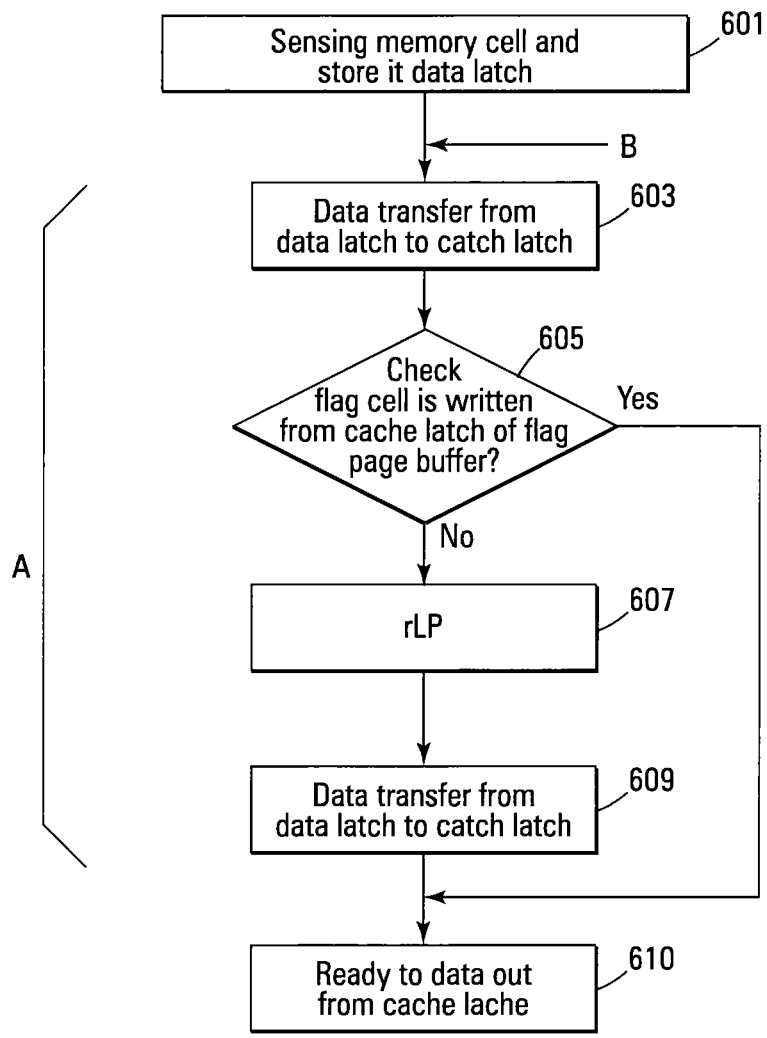
FIG. 6 shows a flow chart of a typical prior art lower page read operation.

FIG. 6 illustrates a flowchart of a typical prior art method for a lower page read operation. The procedure is comprised of sensing the memory cell and storing the sensed data in the data latch 601. The read voltage r00 is used during the read operation.

The data is then transferred from the data latch to the cache latch 603. The flag cell is then checked 605 from the output of the cache latch of the flag page buffer. If the flag has been set, upper page data of MLC data has been read and the data is ready to be read from the cache latch 610. If the flag is not set, the rLP voltage is applied to the selected word line 607 in order to read the lower page of data. The data is then transferred from the data latch to the cache latch 609. The data is then read out from the cache latch 610.

With this operation, a user can attempt to read cache latch data (i.e., previous read data) at any time. If the user tries to read the cache data during the period A indicated in FIG. 6, the data is latched in the data latch and cannot be transferred to the cache latch. Therefore, the lower page reading algorithm stops at point B indicated in FIG. 6.

The reading is resumed after the user access to the cache latch has been completed. The prior art method does not allow background reading to occur since the flag data cell check is coming from the cache latch data.

Figure 7:
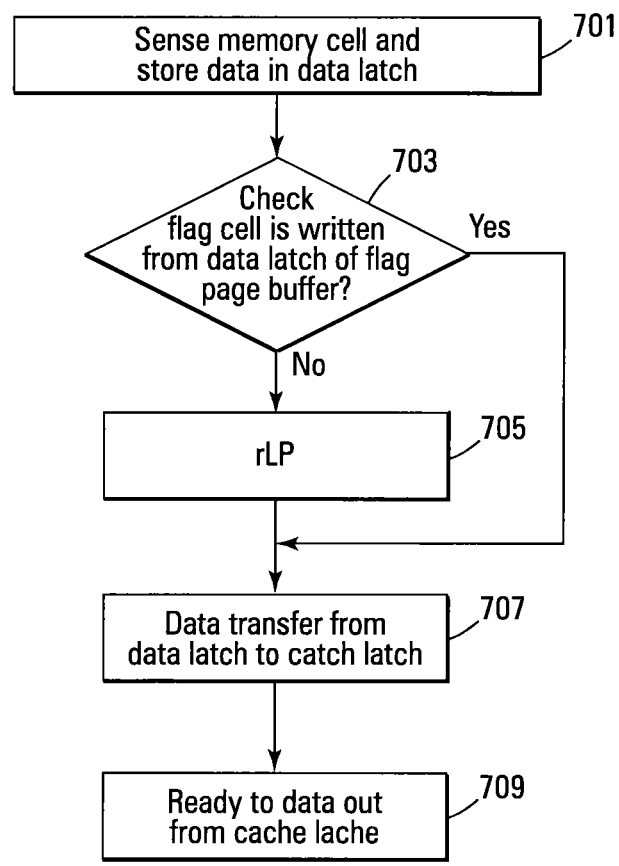
FIG. 7 shows one embodiment of lower page read process of the present invention.

FIG. 7 illustrates a flow chart of one embodiment of the method of the present invention for performing a lower page read operation. The method of FIG. 7 should be read in conjunction with the block diagram of FIG. 5 that illustrates the data and cache latches. The selected memory cell is biased at a read voltage r00 and the resulting read data is sensed 701. The data is stored in the data latch 701.

The flag data is checked for the read data 703. In one embodiment, the flag is either a logical "1" state or a logical "0" state to provide an indication. The flag cell is written from the data latch of the flag page buffer. If the flag is indicating that lower page data been read, the data is transferred from the data latch to the cache latch 707. The data is then read out of the cache latch 709.

If the flag indicates that the upper page data is not written 703, the selected word line is biased at the rLP voltage 705 (e.g., 0V to 0.8V) in order to read the lower page of data. This can be accomplished by turning on a voltage pump to generate the appropriate voltage. The data is then transferred from the data latch to the cache latch 707. The data is now ready to be read out from the cache latch 709.

By performing the flag cell data check through the verify path from the data latch instead of the cache latch, the lower page read procedure of the present invention greatly improves read data throughput. This is accomplished without affecting the cache data, that is being accessed by the user, from a previous read of the latched data.

Figure 8:
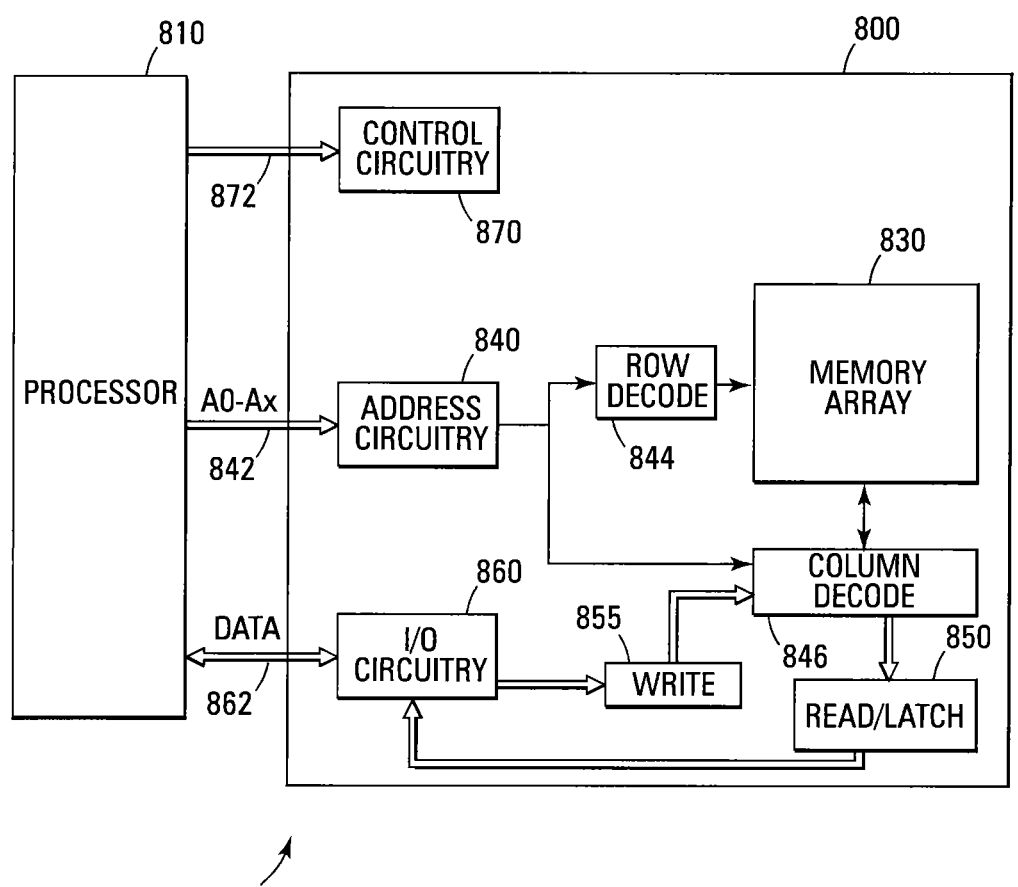
FIG. 8 shows a block diagram of one embodiment of a memory system of the present invention.

FIG. 8 illustrates a functional block diagram of a memory device 800 that can incorporate the flash memory array and programming method embodiments of the present invention. The memory device 800 is coupled to a processor 810. The processor 810 may be a microprocessor or some other type of controlling circuitry. The memory device 800 and the processor 810 form part of a memory system 820. The memory device 800 has been simplified to focus on features of the memory that are helpful in understanding the present invention.

The memory device includes an array of flash memory cells 830 as described above with reference to FIG. 8. The memory array 830 is arranged in banks of rows and columns. The control gates of each row of memory cells is coupled with a word line while the drain and source connections of the memory cells are coupled to bitlines. As is well known in the art, the connections of the cells to the bitlines determines whether the array is a NAND architecture, an AND architecture, or a NOR architecture.

An address buffer circuit 840 is provided to latch address signals provided on address input connections A0-Ax 842. Address signals are received and decoded by a row decoder 844 and a column decoder 846 to access the memory array 830. It will be appreciated by those skilled in the art, with the benefit of the present description, that the number of address input connections depends on the density and architecture of the memory array 830. That is, the number of addresses increases with both increased memory cell counts and increased bank and block counts.

The memory device 800 reads data in the memory array 830 by sensing voltage or current changes in the memory array columns using sense/buffer circuitry 850. The sense/buffer circuitry, in one embodiment, is coupled to read and latch a row of data from the memory array 830. Data input and output buffer circuitry 860 is included for bi-directional data communication over a plurality of data connections 862 with the controller 810. Write circuitry 855 is provided to write data to the memory array.

Control circuitry 870 decodes signals provided on control connections 872 from the processor 810. These signals are used to control the operations on the memory array 830, including data read, data write (program), and erase operations. The control circuitry 870 may be a state machine, a sequencer, or some other type of controller. In one embodiment, the control circuitry 870 executes the embodiments of the lower page read method of the present invention.

The flash memory device illustrated in FIG. 8 has been simplified to facilitate a basic understanding of the features of the memory. A more detailed understanding of internal circuitry and functions of flash memories are known to those skilled in the art.

Figure 9:
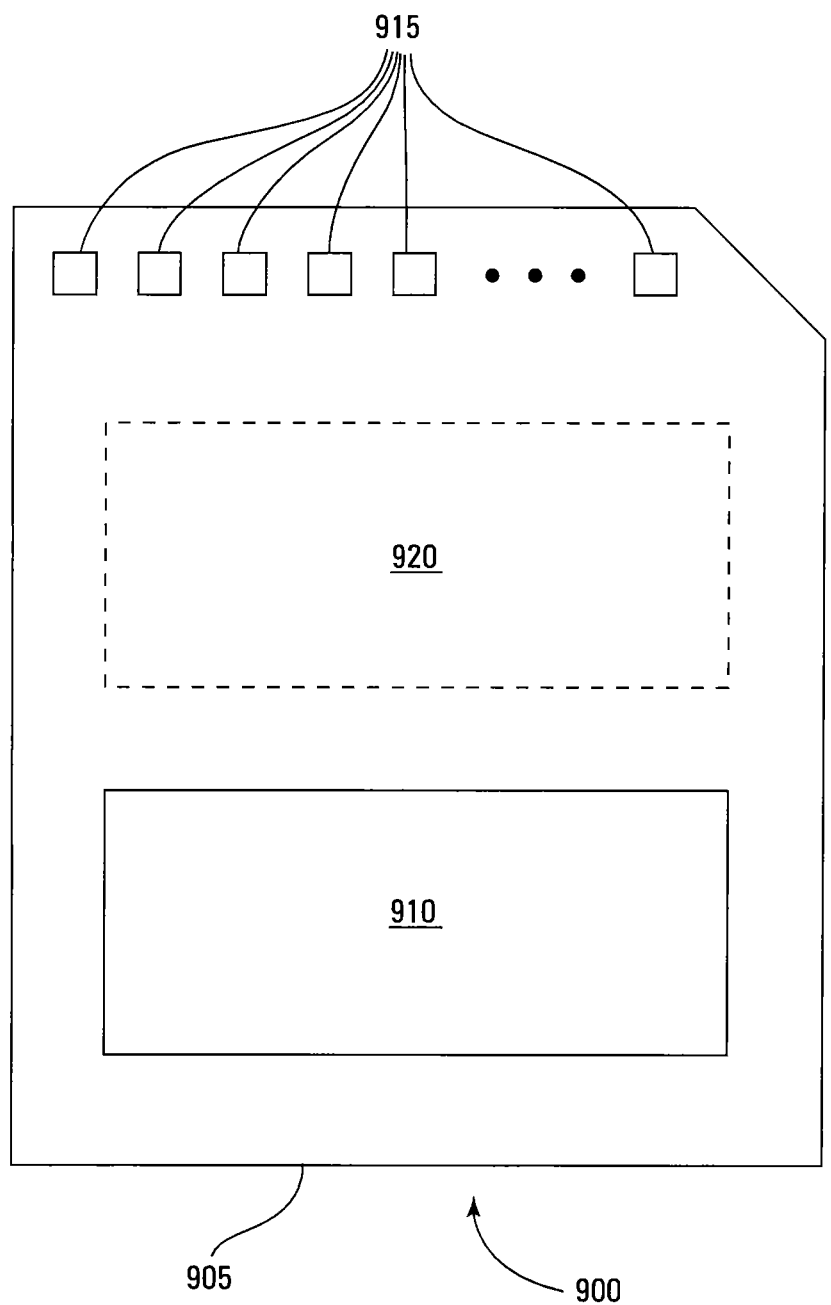
FIG. 9 shows a block diagram of one embodiment of a memory module of the present invention.

FIG. 9 is an illustration of an exemplary memory module 900. Memory module 900 is illustrated as a memory card, although the concepts discussed with reference to memory module 900 are applicable to other types of removable or portable memory, e.g., USB flash drives, and are intended to be within the scope of "memory module" as used herein. In addition, although one example form factor is depicted in FIG. 9, these concepts are applicable to other form factors as well.

In some embodiments, memory module 900 will include a housing 905 (as depicted) to enclose one or more memory devices 910, though such a housing is not essential to all devices or device applications. At least one memory device 910 is a non-volatile memory [including or adapted to perform elements of the invention]. Where present, the housing 905 includes one or more contacts 915 for communication with a host device. Examples of host devices include digital cameras, digital recording and playback devices, PDAs, personal computers, memory card readers, interface hubs and the like. For some embodiments, the contacts 915 are in the form of a standardized interface. For example, with a USB flash drive, the contacts 915 might be in the form of a USB Type-A male connector. For some embodiments, the contacts 915 are in the form of a semi-proprietary interface, such as might be found on COMPACTFLASH memory cards licensed by SANDISK Corporation, MEMORYSTICK memory cards licensed by SONY Corporation, SD SECURE DIGITAL memory cards licensed by TOSHIBA Corporation and the like. In general, however, contacts 915 provide an interface for passing control, address and/or data signals between the memory module 900 and a host having compatible receptors for the contacts 915.

The memory module 900 may optionally include additional circuitry 920 which may be one or more integrated circuits and/or discrete components. For some embodiments, the additional circuitry 920 may include a memory controller for controlling access across multiple memory devices 910 and/or for providing a translation layer between an external host and a memory device 910. For example, there may not be a one-to-one correspondence between the number of contacts 915 and a number of I/O connections to the one or more memory devices 910. Thus, a memory controller could selectively couple an I/O connection (not shown in FIG. 9) of a memory device 910 to receive the appropriate signal at the appropriate I/O connection at the appropriate time or to provide the appropriate signal at the appropriate contact 915 at the appropriate time. Similarly, the communication protocol between a host and the memory module 900 may be different than what is required for access of a memory device 910. A memory controller could then translate the command sequences received from a host into the appropriate command sequences to achieve the desired access to the memory device 910. Such translation may further include changes in signal voltage levels in addition to command sequences.

The additional circuitry 920 may further include functionality unrelated to control of a memory device 910 such as logic functions as might be performed by an ASIC (application specific integrated circuit). Also, the additional circuitry 920 may include circuitry to restrict read or write access to the memory module 900, such as password protection, biometrics or the like. The additional circuitry 920 may include circuitry to indicate a status of the memory module 900. For example, the additional circuitry 920 may include functionality to determine whether power is being supplied to the memory module 900 and whether the memory module 900 is currently being accessed, and to display an indication of its status, such as a solid light while powered and a flashing light while being accessed. The additional circuitry 920 may further include passive devices, such as decoupling capacitors to help regulate power requirements within the memory module 900.

CONCLUSION

In summary, the embodiments of the present invention provides an improved cache read time in comparison to the prior art cache read. This is accomplished by reading the lower page read indication (i.e., flag data) out from the primary data cache (i.e., data latch) instead of the secondary data cache (i.e., cache latch) in order to determine whether a lower page read is necessary. A separate flag data connection for the flag data from the page buffers is used so that the flag page buffer data can be read out more quickly than the prior art.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for reading a memory device having a plurality of memory cells that each simultaneously store a lower page of data and an upper page of data, the memory device comprising a primary data latch and a secondary data latch, the method comprising:
sensing memory cell data;
storing the memory cell data in the primary data latch;
reading flag data from the primary data latch;
if the flag data indicates that a lower page read operation is not requested:
transferring upper page memory cell data from the primary data latch to the secondary data latch; and
reading the data from the secondary data latch; and
if the flag data indicates that the lower page read operation is requested:
generating a lower page read voltage to read the lower page of data from memory cell;
transferring upper page and lower page memory cell data from the primary data latch to the secondary data latch; and
reading the data from the secondary data latch.

2. The method of claim 1 wherein the lower and upper pages of data are indicated by four levels of threshold voltage distributions.

3. The method of claim 1 wherein the lower page read voltage biases a selected word line.

4. The method of claim 1 wherein the lower page read voltage is less than an upper page read voltage.

5. The method of claim 1 wherein a single level cell of the plurality of memory cells has two threshold voltage distributions and the lower page read voltage is between the two distributions.

6. The method of claim 1, wherein reading flag data further comprises writing flag data to the primary data latch from an array of flag memory cells before reading the flag data from the primary data latch.

7. The method of claim 6, wherein writing flag data to the primary data latch further comprises reading the array of flag memory cells to determine whether each memory cell of the plurality of memory cells is multilevel cell memory or single level cell memory.

8. The method of claim 1, wherein generating the lower page read voltage comprises generating a first state read voltage that is between two levels of the cell.

9. The method of claim 8, wherein the first state read voltage is greater than the lower page read voltage.

10. The method of claim 1, wherein the lower page read voltage is in a range of 0V to 0.8V.

11. The method of claim 1, and further comprising turning on a voltage pump to generate the lower page read voltage.

12. The method of claim 1, wherein reading flag data from the primary data latch comprises reading a flag memory cell array to determine whether each memory cell of the plurality of memory cells is multilevel cell memory or single level cell memory.

13. A memory system comprising:
a processor that generates memory signals; and
a flash memory device coupled to the processor and operating in response to the memory signals, the flash memory device comprising:
a memory array comprising a plurality of non-volatile memory cells, each memory cell adapted to be multiple level cells;
a flag memory array for storing flag data indicating whether a lower page read is to be performed;
a data latch coupled to the memory array and the flag memory array for storing sensed data from a selected memory cell;
a cache latch coupled to the data latch for storing data from the data latch; and
control circuitry that is adapted to read, from the data latch, flag data indicating whether to perform a lower page read operation.

14. The system of claim 13 wherein the memory array is a NAND architecture memory array.

15. The system of claim 13, and further comprising a controller configured to:
sense memory cell data, store the memory cell data in the data latch, read flag data from the flag memory array, and
if the flag data indicates that a lower page read operation is not requested, transfer upper page memory cell data from the data latch to the cache latch, and read the data from the cache data latch; and
if the flag data indicates that the lower page read operation is requested, generate a lower page read voltage to read the lower page of data from memory cell, transfer upper page and lower page memory cell data from the data latch to the cache data latch, and read the data from the cache data latch.

16. The system of claim 13, and further comprising a voltage pump to generate a lower page read voltage for reading the lower page.

17. The system of claim 16, wherein the controller is further configured to generate the lower page read voltage at a level below an upper page read voltage.

18. A memory module comprising:
a memory device comprising:
a memory array comprising a plurality of non-volatile memory cells, each memory cell adapted to be multiple level cells;
a flag memory array for storing flag data indicating whether a lower page read is to be performed;
a data latch coupled to the memory array and the flag memory array for storing sensed data from a selected memory cell;
a cache latch coupled to the data latch for storing data from the data latch; and
control circuitry that is adapted to read, from the data latch, flag data indicating whether to perform a lower page read operation;
a housing for enclosing the memory device; and
a plurality of contacts coupled to the housing and configured to provide selective contact between the memory array and a host system.

19. The module of claim 18 and further including a memory controller coupled to the memory array for controlling operation of the memory device in response to the host system.

20. A memory module comprising:
at least two memory devices, each comprising:
- a memory array comprising a plurality of non-volatile memory cells, each memory cell adapted to be multiple level cells;
- a flag memory array for storing flag data indicating whether a lower page read is to be performed;
- a data latch coupled to the memory array and the flag memory array for storing sensed data from a selected memory cell;
- a cache latch coupled to the data latch for storing data from the data latch; and
- control circuitry that is adapted to read, from the data latch, flag data indicating whether to perform a lower page read operation; and a plurality of contacts configured to provide selective contact between the memory array and a host system.

* * * * *

UNITED STATES PATENT AND TRADEMARK OFFICE
CERTIFICATE OF CORRECTION

| | |
|---|---|
| PATENT NO. | : 8,656,092 B2 |
| APPLICATION NO. | : 13/762874 |
| DATED | : February 18, 2014 |
| INVENTOR(S) | : Chang Wan Ha |

It is certified that error appears in the above-identified patent and that said Letters Patent is hereby corrected as shown below:

On the title page, in item (74), in column 2, line 1, Delete "Leffery" and insert -- Leffert --, therefor.

Signed and Sealed this
Twenty-second Day of April, 2014

Michelle K. Lee
*Deputy Director of the United States Patent and Trademark Office*